United States Patent
Schikora

(10) Patent No.: US 11,563,283 B2
(45) Date of Patent: Jan. 24, 2023

(54) PRESS-FIT CONNECTION

(71) Applicant: ZF Friedrichshafen AG, Friedrichshafen (DE)

(72) Inventor: Christoph Schikora, Regensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 29 days.

(21) Appl. No.: 16/971,628

(22) PCT Filed: Feb. 5, 2019

(86) PCT No.: PCT/EP2019/052710
§ 371 (c)(1),
(2) Date: Aug. 20, 2020

(87) PCT Pub. No.: WO2019/162077
PCT Pub. Date: Aug. 29, 2019

(65) Prior Publication Data
US 2020/0403332 A1     Dec. 24, 2020

(30) Foreign Application Priority Data
Feb. 20, 2018    (DE) .......................... 102018202528.2

(51) Int. Cl.
*H01R 12/58*     (2011.01)
*H01R 12/52*     (2011.01)
(Continued)

(52) U.S. Cl.
CPC ......... *H01R 12/585* (2013.01); *H01R 12/523* (2013.01); *H05K 5/0082* (2013.01);
(Continued)

(58) Field of Classification Search
CPC .. H01R 12/585; H01R 12/523; H05K 5/0082; H05K 7/142; H05K 2201/10409; H05K 2201/1059; H05K 7/205
See application file for complete search history.

(56) References Cited

U.S. PATENT DOCUMENTS

| | | | | |
|---|---|---|---|---|
| 6,024,603 A | * | 2/2000 | Chen | H01R 12/7047 439/571 |
| 6,386,911 B1 | * | 5/2002 | Biermann | H01R 12/7064 439/571 |

(Continued)

FOREIGN PATENT DOCUMENTS

| | | |
|---|---|---|
| DE | 19901534 A1 | 8/2000 |
| DE | 20 2004 012 466 U1 | 1/2005 |

(Continued)

OTHER PUBLICATIONS

International Search Report and Written Opinion of the International Search Authority dated May 15, 2019 in International Application No. PCT/EP2019/052710 (English and German languages) (14 pp.).

(Continued)

*Primary Examiner* — Truc T Nguyen
(74) *Attorney, Agent, or Firm* — Crowell & Moring LLP

(57) ABSTRACT

An apparatus may include a press-fit connection for a printed circuit board and a connecting element, where the connecting element is pressed into the printed circuit board in that the connecting element is tapered at the end facing the printed circuit board, and where an insertion depth to which the tapered section is inserted in the printed circuit board ensures a compensation for tolerances.

19 Claims, 2 Drawing Sheets

(51) Int. Cl.
*H05K 5/00* (2006.01)
*H05K 7/14* (2006.01)
(52) U.S. Cl.
CPC ..... *H05K 7/142* (2013.01); *H05K 2201/1059* (2013.01); *H05K 2201/10409* (2013.01)

(56) References Cited

U.S. PATENT DOCUMENTS

| | | | |
|---|---|---|---|
| 7,086,896 B2 * | 8/2006 | Edwards | H05K 7/142 |
| | | | 439/573 |
| 2009/0241538 A1 | 10/2009 | Yoshinaga et al. | |
| 2013/0343017 A1 | 12/2013 | Stoehr et al. | |
| 2018/0159266 A1 * | 6/2018 | Yu | H01R 12/58 |

FOREIGN PATENT DOCUMENTS

| | | |
|---|---|---|
| DE | 10 2010 062 761 A1 | 6/2012 |
| DE | 10 2013 215 364 A1 | 2/2015 |
| DE | 10 2014 220 288 A1 | 4/2016 |
| EP | 1624531 A1 | 2/2006 |
| EP | 2999315 A1 | 3/2016 |
| WO | WO 2013/068054 A1 | 5/2013 |

OTHER PUBLICATIONS

Office Action for German Application No. 10 2018 202 528.2, dated May 13, 2022 (10 pages).

* cited by examiner

PRESS-FIT CONNECTION

RELATED APPLICATIONS

This application is a filing under 35 U.S.C. § 371 of International Patent Application PCT/EP2019/052710, filed Feb. 5, 2019, and claiming priority to German Patent Application 10 2018 202 528.2, filed Feb. 20, 2018. All applications listed in this paragraph are hereby incorporated by reference in their entireties.

BACKGROUND

The present invention relates to a press-fit connection between a connecting element and a printed circuit board, and an electronics module that has a press-fit connection. The invention also relates to a control unit that has a press-fit connection and/or an electronics module, and to a vehicle. The invention furthermore relates to a production process for an electronic module.

Press-fit connections between printed circuit boards and connecting elements are known, e.g., from DE 202004012466 U1.

Transmission controls that have electronics modules are also known. By way of example, DE 102010062761 A1 discloses an electronics module for control unit in a vehicle transmission. Accordingly, there is a populated printed circuit board that has one or more housing elements, which encompass components on one or both sides of the printed circuit board. Such a housing element is made of plastic, for example, and protects the components from contaminants and external influences. It is also known to place casting compound inside the housing to protect components against vibrations or to obtain a better thermal connection to a housing element.

BRIEF DESCRIPTION OF THE DRAWINGS

The present invention shall be explained below in greater detail in reference to the schematic drawings. Therein.

Figure 1:
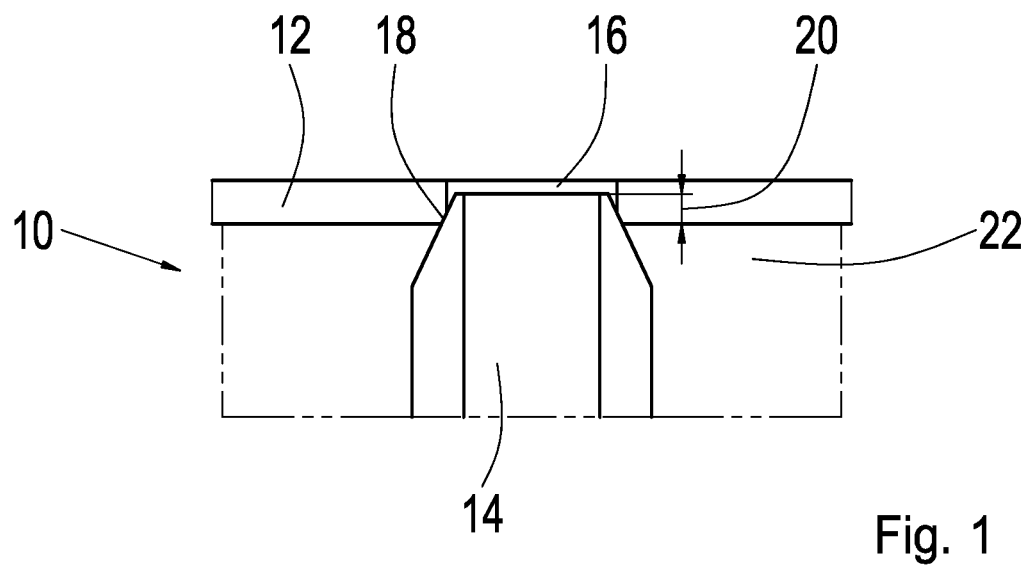
FIG. 1 shows a schematic sectional view of an embodiment of the invention.

The attached drawings are intended to provide a better understanding of the embodiments of the invention. They illustrate embodiments and clarify the principles and concepts of the invention in conjunction with the description. Other embodiments and many of the specified advantages can be derived from the drawings. It should also be noted that the elements in the drawings are not necessarily drawn to scale.

Identical, functionally identical, and elements, features and components acting in the same manner are given the same reference symbols in the drawings, if not otherwise specified.

DETAILED DESCRIPTION

In one aspect, the present disclosure relates to the following: a press-fit connection between a printed circuit board and a connecting element, wherein the connecting element is pressed into the printed circuit board in that the connection element is tapered at the end facing the printed circuit board. An insertion depth to which the tapered section is pressed into the printed circuit board ensures compensation for any tolerances.

In a second aspect, the present disclosure relates to a method including the following: a production process for producing an electronics module, comprising the following steps:

pressing a tapered end of a connecting element, in particular a bushing, into a hole in a printed circuit board such that the connecting element extends in part into the hole in the printed circuit board;

placing a component on the printed circuit board; and coating the component and the connecting element with a casting compound such that the compound is bonded to the printed circuit board.

A press-fit connection is a connection between two parts formed by friction. A press-fit connection is a force-fit connection.

The insertion depth for a press-fit connection is a measure of the depth to which a first part of the press-fit connection is pressed into another part of the press-fit connection.

Vehicles, as set forth in this patent application, are motor-driven land vehicles. This also includes rail vehicles.

A control unit is an electronics module for controlling or regulating. Control units are used in the automotive industry in all imaginable electronics fields, as well as for controlling machines, apparatuses and various technological processes.

An example of a connecting element is a bushing. A bushing is a tube that receives a corresponding part.

One fundamental idea of the invention is to obtain a compensation for tolerances via an insertion depth of the connecting element into the printed circuit board by means of a tapered connecting element, which is pressed into a hole in a printed circuit board.

Advantageous embodiments and developments of the invention can be derived from the dependent claims and the description in reference to the drawings.

According to a preferred development of the invention, the connecting element has a first diameter at the tapered section that is smaller than that of the hole. The connecting element also has a second diameter in the tapered section, which is greater than the first diameter. This seals the press-fit connection against liquids. Liquid-tight connections are particularly advantageous in many applications. By way of example, because fluid is frequently contained in transmission control units, a liquid-tight connection increases the service life of a transmission control unit.

Liquid-tight means that the connection seals against liquids at the pressures occurring in a particular application. Gas-tight connections are not regarded as being the same as liquid-tight connections.

According to a preferred development of the invention, the press-fit connection can be coated by a casting compound that contains epoxy resin in particular.

This means, in particular, that the press-fit connection between the connecting element and the printed circuit board is sealed such that no casting compound can pass through the press-fit connection when it is applied.

According to a preferred development of the invention, the press-fit connection also comprises a screw that attaches the printed circuit board and the connecting element to a support element in that the screw is inserted into the hole in the printed circuit board, and into the connecting element.

Screws ensure a particularly sturdy and simple connection. Alternatively, bolts, pegs, or pins can be used.

According to a preferred development of the invention, the connecting element is a bushing. This allows the press-fit connection to come in contact with, or be attached to another connecting means.

If this is not necessary, a male connecting element can be used instead of a bushing.

According to a preferred development of the invention, the connecting element and the hole are aligned coaxially to one another. This coaxial alignment ensures a particularly effective seal.

Furthermore, according to the following description, the press-fit connection can also serve as an electrical contact. In this case, a coaxial alignment of the connecting element in the hole helps reduce a passive intermodulation (PIM) of an electrical signal.

According to a preferred development of the invention, the press-fit connection is designed to attach a component to the printed circuit board. The compensation for tolerances in this case forms an adaptation to a structural height of the component in relation to the printed circuit board. It is advantageous to place some components directly on a surface of the printed circuit board. With mass production, this can be particularly easily ensured by means of a compensation for tolerances.

By way of example, a heat sink that is to be attached as a component to the printed circuit board lies on a metallic surface on the printed circuit board. This improves the efficacy of a heat sink.

Components can be both electrical components and mechanical components. An electrical component is part of an electrical circuit. Electrical components include resistors, capacitors, inductors, etc. Examples of a mechanical component are a passive heat sink, a mechanical fastener, etc.

According to a preferred development of the invention, the press-fit connection forms an electrical contact element in that the connecting element contains an electrically conductive surface in contact with a conductor path on the printed circuit board.

This conductor path is located on a printed circuit board or within a printed circuit board. It is particularly advantageous to use the electrical connection for currents between 60 and 100 A. If an electrical connection is needed, this saves space that may be necessary for an electrical connection.

It also makes sense for the hole in the printed circuit board to form a via through which the connecting element is in contact with the printed circuit board. In this manner, a particularly reliable electrical connection to the printed circuit board is obtained for establishing contact to the connecting element. As a result, it is also unnecessary to separately obtain contact between the connecting element and the printed circuit board, e.g. through soldering.

FIG. 1 shows a schematic sectional view of a press-fit connection 10 according to an embodiment of the invention. The press-fit connection 10 comprises a printed circuit board 12 and a connecting element 14. The connecting element 14 is tapered 18 at the end facing the printed circuit board and is pressed into a hole 16 in the printed circuit board 12 to the insertion depth 20. The printed circuit board 12 is produced such that it does not become deformed as a result of the insertion, and does not bend in particular.

The insertion depth 20 for the press-fit connection 10 can vary. In this manner, tolerance compensations are obtained with regard to a structural height of the connecting element 14 in relation to the printed circuit board 12.

The press-fit connection 10 is coated with a casting compound 22, in this case an epoxy resin compound. It can be seen that the press-fit connection 10 is sealed in that, when the press-fit connection 10 is being coated with the casting compound 22, none of the casting compound 22 passes through the hole 16.

Figure 2:
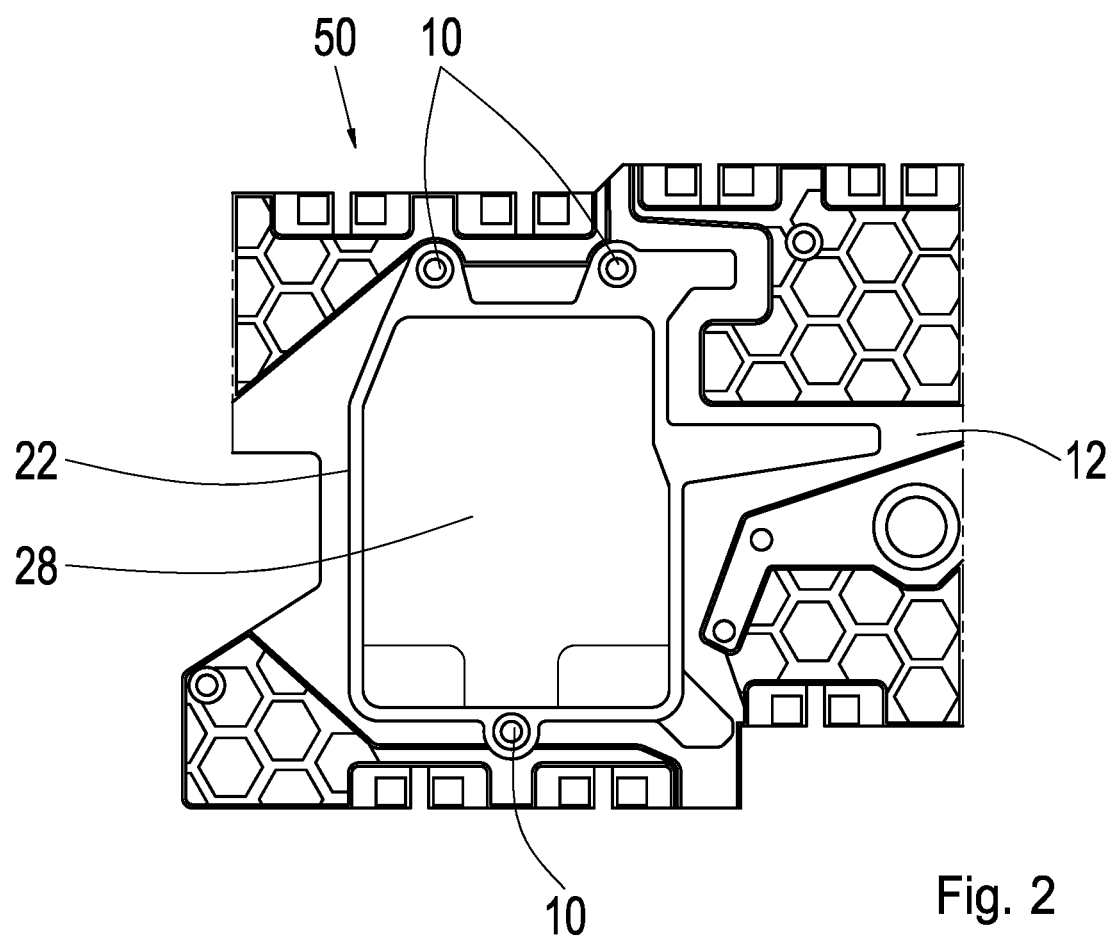
FIG. 2 shows a schematic top view of an embodiment of the invention.

FIG. 2 shows an electronics module 50 that contains numerous press-fit connections 10 in a schematic top view. The electronics module 50 forms a control unit for an automatic transmission in a vehicle, and comprises a heat sink 28 coated in a casting compound 22, which is attached to the printed circuit board 12 by means of the casting compound 22 and numerous press-fit connections 10. The heat sink 28 lies on a metallic surface (not shown) on the printed circuit board 12.

A physical contact between the printed circuit board 12 and the heat sink 28 made of a thermally conductive material is ensured by the functioning of the press-fit connection 10 of compensating for tolerances.

Figure 3:
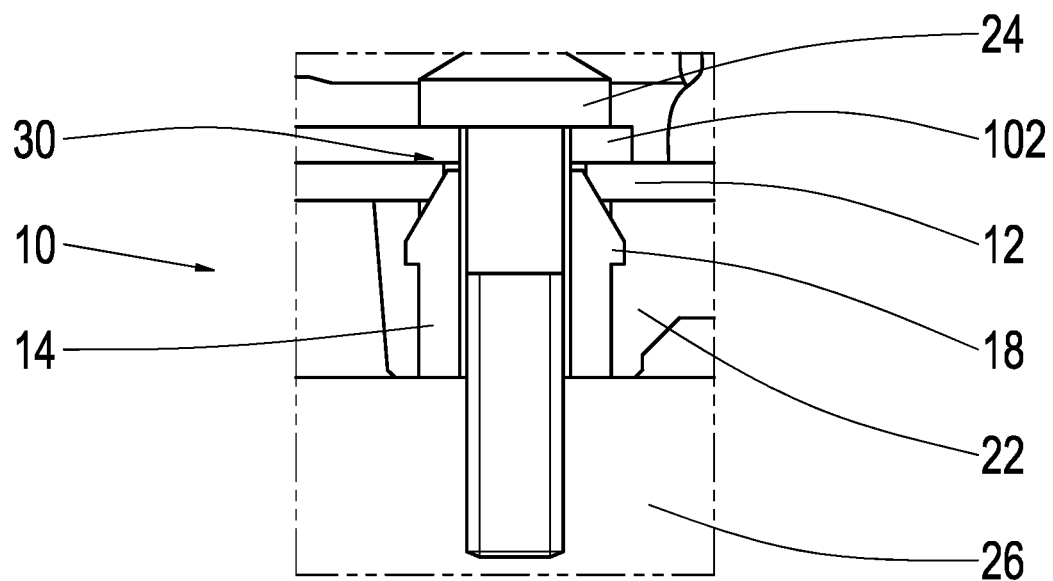
FIG. 3 shows a schematic sectional view of an embodiment of the invention.

FIG. 3 shows a press-fit connection 10 according to FIG. 1 for attaching an electronics module 50 to a support element 26. The electronics module 50 forms a control unit for an automatic transmission in FIG. 3. The support element 26 is formed by an aluminum block in the transmission control unit.

In addition to the printed circuit board 12, the connecting element 14 and the casting compound 22, the press-fit connection 10 also contains a screw 24. The screw 24 is placed in a hole in a spacer 102, a hole in the printed circuit board 12, and in the connecting element, and screwed to the support element 26. The screw accordingly secures the printed circuit board 12, along with the connecting element 14 and the casting compound 22, to the support element 26.

REFERENCE SYMBOLS 10 press-fit connection
12 printed circuit board
14 connecting element
16 hole
18 taper
20 insertion depth
22 casting compound
24 screw
26 support element
28 component
30 via
102 spacer

The invention claimed is:

1. An apparatus, comprising:
a printed circuit board and a connecting element, and
a press-fit connection between the printed circuit board and the connecting element,
wherein the connecting element is pressed into a hole in the printed circuit board and a tapered section of the connecting element is tapered at an end facing the printed circuit board, and
wherein an insertion depth to which the tapered section is pressed into the printed circuit board is less than a total depth of the hole, and
wherein the connecting element has a first diameter at the tapered section that is smaller than that of the hole, and a second diameter that is greater than that of the hole to seal the press-fit connection against liquids.

2. The apparatus according to claim 1, wherein the press-fit connection is coated by a casting compound that contains an epoxy resin in particular.

3. The apparatus according to claim 1, further comprising a screw that attaches the printed circuit board and the connecting element to a support element, wherein the screw is screwed into the hole in the printed circuit board and into the connecting element.

4. The apparatus according to claim 1, wherein the connecting element includes a bushing.

5. The apparatus according to claim 1, wherein the connecting element and the hole are aligned coaxially to one another.

6. The apparatus according to claim 1, wherein the press-fit connection is configured to attach a component to the printed circuit board.

7. The apparatus according to claim 1, wherein the connecting element has an electrically conductive surface in contact with a conductor path in the printed circuit board.

8. The apparatus according to claim 7, wherein the hole in the printed circuit board includes a via that forms an electrical contact between the connecting element and the printed circuit board.

9. The apparatus of claim 1, further comprising a component on the printed circuit board, and a casting compound that contains an epoxy resin, wherein the casting compound coats the component, and wherein the press-fit connection attaches the component to the printed circuit board.

10. A control unit for a vehicle transmission that contains the apparatus according to claim 9.

11. A vehicle that has the apparatus of claim 1.

12. A method for forming an electronics module that comprises the following steps:
pressing a tapered section of a connecting element into a hole in a printed circuit board such that the connecting element extends partially into the hole in the printed circuit board;
placing a component on the printed circuit board; and
coating the component and the connecting element with a casting compound such that the component is attached to the printed circuit board.

13. The method of claim 12, wherein the connecting element includes a bushing.

14. An apparatus, comprising:
a printed circuit board and a connecting element, and
a press-fit connection between the printed circuit board and the connecting element,
wherein the connecting element is pressed into a hole in the printed circuit board and a tapered section of the connecting element is tapered at an end facing the printed circuit board, and
wherein an insertion depth to which the tapered section is pressed into the printed circuit board less than a total depth of the hole, and
wherein the press-fit connection is coated by a casting compound that contains an epoxy resin in particular.

15. The apparatus according to claim 14, further comprising a screw that attaches the printed circuit board and the connecting element to a support element, wherein the screw is screwed into the hole in the printed circuit board and into the connecting element.

16. The apparatus according to claim 14, wherein the connecting element includes a bushing.

17. The apparatus according to claim 14, wherein the connecting element and the hole are aligned coaxially to one another.

18. The apparatus according to claim 14, wherein the press-fit connection is configured to attach a component to the printed circuit board.

19. The apparatus according to claim 14, wherein the connecting element has an electrically conductive surface in contact with a conductor path in the printed circuit board.

* * * * *